(12) United States Patent
Kononchuk (10) Patent No.: US 9,911,616 B2
(45) Date of Patent: Mar. 6, 2018

(54) PROCESS FOR TREATING A STRUCTURE

(71) Applicant: Soitec, Crolles (FR)

(72) Inventor: Oleg Kononchuk, Grenoble (FR)

(73) Assignee: Soitec, Crolles (FR)

( * ) Notice: Subject to any disclaimer, the term of this patent is extended or adjusted under 35 U.S.C. 154(b) by 0 days.

(21) Appl. No.: 14/770,378

(22) PCT Filed: Feb. 25, 2014

(86) PCT No.: PCT/FR2014/050397
§ 371 (c)(1),
(2) Date: Aug. 25, 2015

(87) PCT Pub. No.: WO2014/131983
PCT Pub. Date: Sep. 4, 2014

(65) Prior Publication Data
US 2016/0005613 A1   Jan. 7, 2016

(30) Foreign Application Priority Data
Feb. 26, 2013 (FR) ..................................... 13 00439

(51) Int. Cl.
*H01L 21/3065* (2006.01)
*H01L 21/02* (2006.01)
(Continued)

(52) U.S. Cl.
CPC ........ *H01L 21/3065* (2013.01); *B23K 26/126* (2013.01); *H01L 21/02675* (2013.01);
(Continued)

(58) Field of Classification Search
None
See application file for complete search history.

(56) References Cited

U.S. PATENT DOCUMENTS

| 4,624,736 A | 11/1986 | Gee et al. |
| 5,656,186 A * | 8/1997 | Mourou ................. A61B 18/20 |
| | | 219/121.69 |

(Continued)

FOREIGN PATENT DOCUMENTS

| CN | 102403206 A | 4/2012 |
| EP | 2485249 A2 | 8/2012 |

OTHER PUBLICATIONS

International Search Report for International Application No. PCT/FR2014/050397 dated Jul. 21, 2014, 2 pages.
(Continued)

*Primary Examiner* — Stephanie P Duclair
(74) *Attorney, Agent, or Firm* — TraskBritt (57) ABSTRACT

The disclosure relates to a process for treating a structure, the structure comprising, from its back side to its front side, a carrier substrate, an insulating layer and a useful layer, the useful layer having a free surface, the structure being placed in an atmosphere containing chemical species, the chemical species being capable of reacting chemically with the useful layer. This treatment process is noteworthy in that the useful layer is heated by a pulsed laser beam, the beam sweeping the free surface, the wavelength of the beam differing by, at most, plus or minus 15 nm from a central wavelength, the central wavelength being chosen so that the sensitivity of the reflectivity of the structure relative to the insulating layer is zero.

20 Claims, 5 Drawing Sheets

(51) Int. Cl.
- B23K 26/12 (2014.01)
- H05K 3/00 (2006.01)
- H01L 21/268 (2006.01)
- H01L 21/302 (2006.01)

(52) U.S. Cl.
CPC ...... *H01L 21/02686* (2013.01); *H01L 21/268* (2013.01); *H01L 21/302* (2013.01); *H05K 3/0026* (2013.01); H01L 21/0262 (2013.01); H01L 21/02488 (2013.01); H01L 21/02664 (2013.01)

(56) References Cited

U.S. PATENT DOCUMENTS

| | | |
|---|---|---|
| 6,830,993 B1 | 12/2004 | Im et al. |
| 2009/0121157 A1 | 5/2009 | Mofatt et al. |
| 2010/0301013 A1* | 12/2010 | Conneely ............ B23K 26/032 216/83 |
| 2012/0329246 A1* | 12/2012 | Finn ................. H01L 21/67207 438/462 |
| 2014/0017880 A1* | 1/2014 | Lei ........................ H01L 21/78 438/462 |

OTHER PUBLICATIONS

Windt, D.L., IMD-Software for Modeling the Optical Properties of Multilayer Filsm, Computer in Physics, vol. 12, No. 4, Jul.-Aug. 1998.

International Preliminary Report on Patentability for International Application No.No. PCT/FR2014/050397 dated Sep. 1, 2015, 6.

International Written Opinion for International Application No. PCT/FR2014/050397 dated Jul. 21, 2014, 5 pages.

Tompkins et al., Appendix C of the book "Spectroscopic Ellipsometry and Reflectometry, a User Guide", Published by Wiley Interscience Publication, 1999, 15 pages.

First Chinese Search for Chinese Application No. 201480010335 dated Feb. 20, 2017, 1 page.

Chinese Office Action for Chinese Application No. 201480010335 dated Feb. 28, 2017, 10 pages.

* cited by examiner

PROCESS FOR TREATING A STRUCTURE

CROSS-REFERENCE TO RELATED APPLICATIONS

This application is a national phase entry under 35 U.S.C. § 371 of International Patent Application PCT/FR2014/050397, filed Feb. 25, 2014, designating the United States of America and published as International Patent Publication WO 2014/131983 A1 on Sep. 4, 2014, which claims the benefit under Article 8 of the Patent Cooperation Treaty and under 35 U.S.C. § 119(e) to French Patent Application Serial No. 1300439, filed Feb. 26, 2013, the disclosure of each of which is hereby incorporated herein in its entirety by this reference.

TECHNICAL FIELD

This disclosure relates to a method for processing a structure.

BACKGROUND

Figure 1:
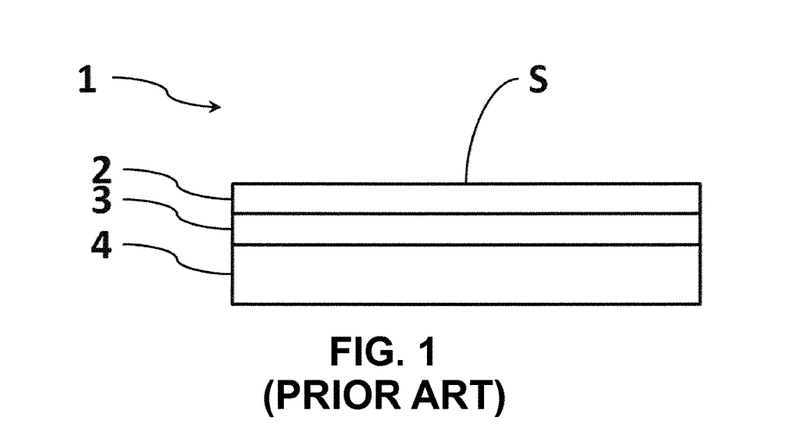
FIG. 1 is a cross-sectional view of a structure treated by a treatment process according to the known techniques of the prior art.

A structure 1 comprises, from its rear side to its front side, a carrier substrate 4, an insulating layer 3, and a useful layer 2, with the useful layer 2 having a free surface S. In a method for processing such a structure 1 known from the state of the art, and illustrated in FIGS. 1 and 2, the structure 1 is placed in an atmosphere comprising chemical species in a gaseous form 6, with the chemical species 6 being likely to chemically react with the useful layer 2, with kinetics strictly increasing with the temperature of the useful layer 2.

Figure 2:
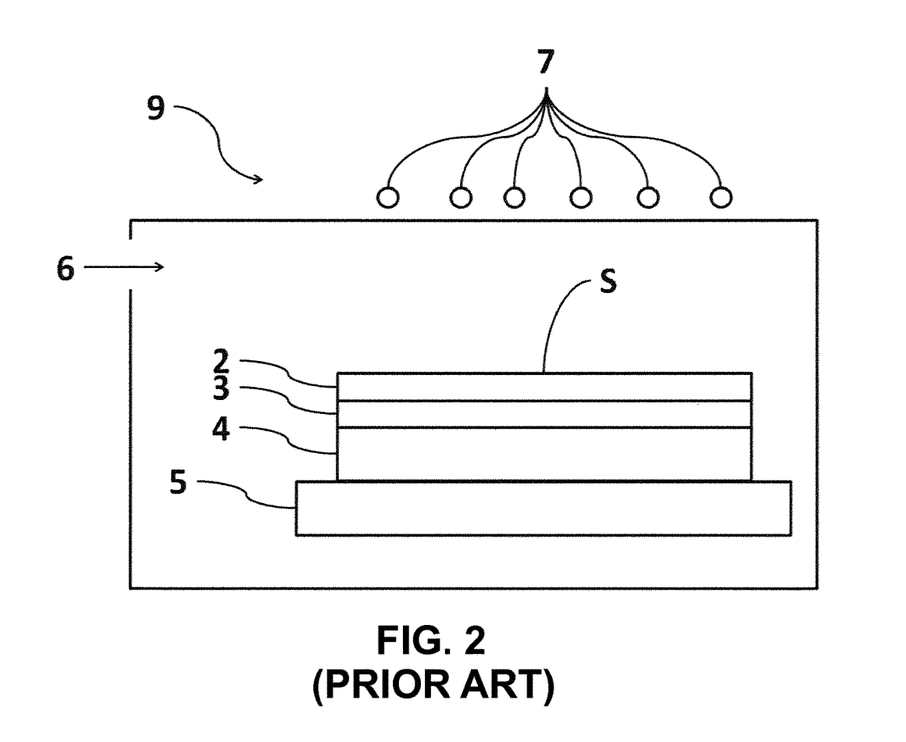
FIG. 2 schematically illustrates a reaction chamber for processing a structure according to the known techniques of the prior art.

During the treatment process, the structure 1 is held on a support structure 5 (or "chuck"). The structure support 5 is positioned in a reaction chamber 9.

The useful layer 2 is generally uniformly heated using a heating system 7, for example, heating resistors or still halogen lamps.

The chemical species 6 injected into the reaction chamber 9 thus chemically react with the free surface S of the useful layer 2. The type of chemical reaction depends on the nature of the chemical species 6 and on the useful layer 2, and may then take the form of a thinning by etching of the useful layer 2, or thickening by epitaxy of the useful layer 2.

However, the useful layer 2 generally has variations in thickness and the methods for etching or thickening by epitaxy are known to be non-uniform and even increasing a bit more the variations in thickness of the useful layer 2. Variations in the thickness of the useful layer 2 thus remain after the treatment process.

Therefore, the main disadvantage of such treatment method is that, during the thinning or thickening reaction, the variations in thickness of the useful layer 2 remain and may even be increased.

The structures 1, such as the structures of the semiconductor-on-insulator (SeOI) type thus have variations in thickness, the spectral analysis of which reveals components having spatial wavelengths varying from a few nanometers (roughness-like) to the size of the structure 1 (non-uniformity-like). Some techniques (smoothing annealing in a reducing atmosphere, for example) make it possible to reduce the variations in spatial wavelength thickness below a certain threshold, for example, 2 μm. However, over the range of spatial wavelengths beyond such threshold, for example, from 2 μm to a few centimeters, reducing the non-uniformities in the thickness of the useful layer 2 remains very difficult.

In particular, a method for thickening the semiconductor layer by epitaxy, or for thinning the semiconductor layer by etching, in a structure 1 of the SeOI type, does not significantly reduce the variations in thickness of the semiconductor layer on an extensive range of wavelengths.

The disclosure, therefore, provides a method for treating a structure 1 aiming at reducing the variations in thickness of the useful layer 2.

BRIEF SUMMARY

This disclosure aims at wholly or partly remedying the aforementioned drawback, and relates to a method for treating a structure, with the structure comprising, from its rear side to its front side, a carrier substrate, an insulating layer, and a useful layer, with the useful layer having a free surface, with the structure being placed in an atmosphere containing chemical species in a gaseous form, with the chemical species being likely to chemically react with the useful layer, with kinetics strictly increasing with the temperature of the useful layer; with the treatment process being characterized in that the useful layer is heated by a pulsed laser beam, with the beam sweeping at least partially the free surface of the useful layer, with the wavelength of the beam being different by less than 15 nm, preferably by less than 7 nm, from a central wavelength for which the sensitivity of the estimated reflectivity of the structure relative to the insulator layer is zero.

The sensitivity of the estimated reflectivity of the structure relative to a layer corresponding to the partial derivative of the reflectivity is relative to the thickness of the layer.

The estimated reflectivity is obtained, in turn, by a preliminary modeling of the structure.

The laser pulses make it possible to generate a heating at the point of impact of the pulses on the free surface of the useful layer.

The temperature thus reached by the useful layer at the point of impact makes it possible to activate the chemical reaction of the chemical species with the useful layer. This temperature is lower than the melting temperature of the material of the useful layer.

For a wavelength of the beam different by less than 15 nm, preferably by less than 7 nm, from the central wavelength, the Applicant has found that the heating of the useful layer only depends on the thickness of such layer.

In other words, the heating of the useful layer, during the sweeping by the laser beam, is substantially independent of the small variations in the thickness of the insulating layer. "Small variations" in the thickness of the insulating layer means variations in the thickness by plus or minus 1 nm.

The wavelength of the laser pulses may be so selected as to heat the thicker areas of the useful layer to a higher temperature than the thinner areas.

Thus, a reaction of thinning by etching, activated by the laser pulses, will have greater kinetics in the thicker areas of the useful layer.

Similarly, the wavelength of the laser pulses may be so selected as to heat the thinner areas of the useful layer to a higher temperature than the thicker areas.

Thus, a reaction of thickening by epitaxy will have greater kinetics in the thinner areas of the useful layer.

Controlling the heating of the useful layer and thus the kinetics of the thickening or thinning reaction relative to thickness thus makes it possible to reduce the variations in thickness of the useful layer.

According to one embodiment, the structure is positioned in a reactive enclosure comprising the chemical species.

According to one embodiment, the duration of the laser beam pulses are less than a tv value, with tv being equal to $t_v = l^2/D$, with D being the coefficient of thermal diffusion in the useful layer, and l corresponding to a threshold wavelength beyond which it is desired to reduce the variations in thickness of the layer.

"Duration" of a laser pulse means a unit time during which a beam is emitted.

For pulse durations smaller than tv, a thermal equilibrium may not be reached over the entire surface of the impact point of the laser pulses on the useful layer. This is particularly advantageous when variations in thickness of the useful layer having a spatial wavelength smaller than the dimension of the impact point of the laser pulses must be corrected. As a matter of fact, for such pulse durations, the point of impact does not undergo a uniform heating over its entire surface; specifically, the thinner areas of the point of impact are not heated to the same temperature as the thicker areas of the point of impact.

According to one embodiment, the pulsed laser beam has a pulse duration of less than 100 ns.

According to one embodiment, the useful layer is a layer of a semiconductor material comprising at least one of the following materials: silicon, germanium, and silicon germanium alloy.

According to one embodiment, the chemical species make it possible to etch the useful layer and the wavelength of the pulsed laser beam is so selected as to correspond to a negative value of the sensitivity of the reflectivity of the structure relative to the useful layer.

Thus, the thicker the area of the useful layer impacted by the laser pulses, the higher the temperature reached during the heating. Therefore, the thicker the area of the useful layer, the more important the etching kinetics. It is, therefore, possible to perform a partial etching of the useful layer over its entire surface while reducing the variation in thickness of the useful layer.

According to one embodiment, the chemical species comprise HCl.

Thus, it is possible to etch a useful layer comprising semiconductor elements such as silicon, germanium, or silicon germanium alloys.

According to one embodiment, the chemical species make it possible to thicken the useful layer by epitaxy, and the wavelength of the pulsed laser beam is so selected as to correspond to a positive value of the sensitivity of the reflectivity of the structure relative to the useful layer.

Thus, the thinner the area of the useful layer impacted by the laser pulses, the higher the temperature reached during the heating.

Therefore, the thinner the area of the useful layer, the more important the kinetics of the thickening by epitaxy. It is, therefore, possible to perform a thickening by epitaxy of the useful layer over its entire surface while reducing the variation in thickness of the useful layer.

According to one embodiment, the chemical species comprise at least one of the following species: silane, disilane, trisilane, monochlorosilane, dichlorosilane, trichlorosilane, tetrachlorosilane germane, monochlorogermane, dichlorogermane, trichlorogermane, and tetrachlorogermane.

According to one embodiment, the insulating layer comprises silicon dioxide.

According to one embodiment, the insulating layer has a thickness of less than 150 nm, preferably less than 50 nm, and more preferably less than 25 nm.

According to one embodiment, the useful layer has a thickness of less than 50 nm, preferably of less than 25 nm.

According to one embodiment, the surface of the impact point of the laser beam on the free surface of the useful layer is greater than 0.1 mm$^2$, preferably greater than 10 mm$^2$.

According to one embodiment, the pulsed laser beam has a pulse energy ranging from 100 to 1,500 mJ/cm$^2$, with such energy range making it possible to obtain a heating of the useful layer compatible with a chemical reaction of the species with the useful layer.

According to one embodiment, the pulsed laser beam has a pulse repetition frequency ranging from 1 Hz to 10 kHz.

According to one embodiment, the useful layer has a variation in thickness of less than 3 nm, preferably of less than 2 nm, even more preferably of less than 1 nm.

BRIEF DESCRIPTION OF THE DRAWINGS

Other characteristics and advantages will emerge from the description that follows of two embodiments of a method for processing a structure according to the disclosure, given as non-restrictive examples, with reference to the appended drawings, wherein.

DETAILED DESCRIPTION

In the various embodiments, the same references are used for elements that are identical or perform the same function for the sake of simplifying the description.

Figure 3:
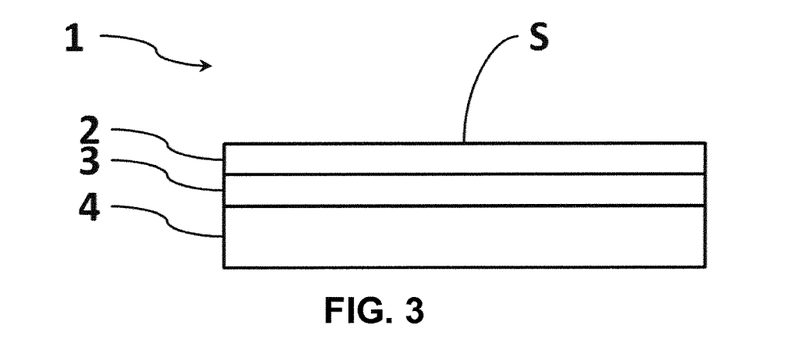
FIG. 3 is a cross-sectional view of a structure treated by a treatment process according to the disclosure.
Figure 4:
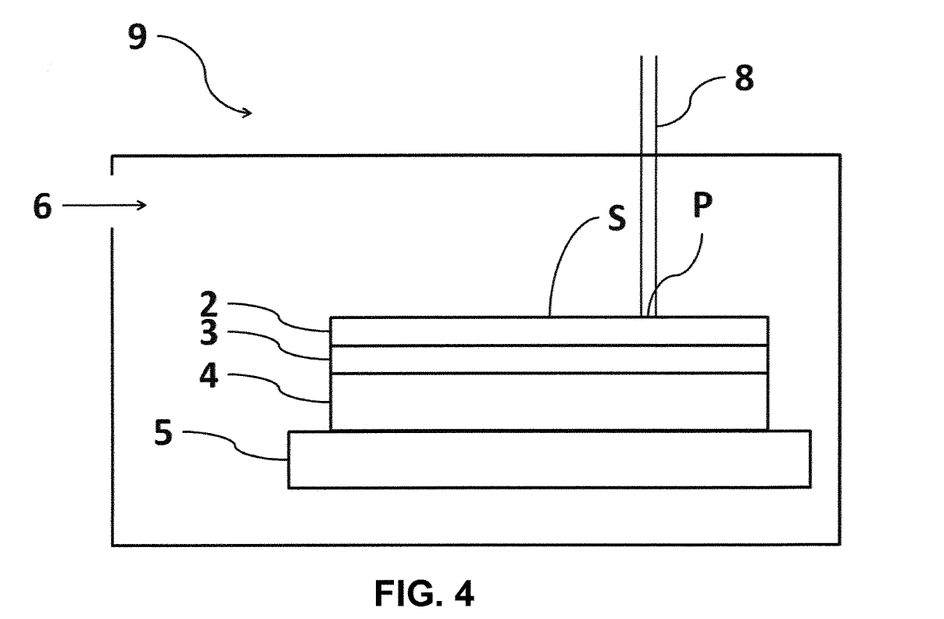
FIG. 4 schematically illustrates a reaction chamber for processing a structure according to the disclosure.

According to the treatment process illustrated in FIGS. 3 and 4, the structure 1 comprising, from its rear side to its front side, a carrier substrate 4, an insulating layer 3, and a useful layer 2 having a free surface S, is positioned in an atmosphere comprising chemical species 6 in a gaseous form, which are likely to chemically react with the useful layer 2 with kinetics strictly increasing with the temperature of the useful layer 2. The active layer 2 is heated by a pulsed laser beam 8, with the beam 8 sweeping, at least in part, the free surface S of the useful layer 2.

The heating obtained in a complex multilayer structure such as the structure 1, is dependent on the way the radiation of the laser beam 8 is reflected on the various interfaces of the structure. As is well known, such reflectivity depends on the nature and the thickness of the layers, on the polarization of the laser, on the angle of incidence and on the wavelength thereof. For a given structure and given conditions of application of the laser, i.e., when the nature of the layers, the polarization, the angle of incidence and the wavelength of the laser are set, the heating of the useful layer 2 obtained at two distinct points of application of the laser will differ according to the variations in thickness of each layer 2 and 3 between these two points. Accordingly, and all other things being equal, the heating profile of the free surface of the useful layer 2 reflects the non-uniformity in the thickness of the useful layer 2 and of the insulating layer 3.

The disclosure tries to position the structure 7 under processing conditions such that the heating profile of the free surface of the useful layer 2 obtained during the sweeping by the laser only depends on the variations in thickness of the useful layer 2 and remains insensitive to the variations in thickness of the insulating layer 3.

For this purpose, the wavelength of the laser beam 8 is so selected as to be different by less than 15 nm, preferably by less than 7 nm, from a central wavelength, for which the sensitivity of the estimated reflectivity of the structure 1 relative to the insulating layer 3 is zero.

The value of the central wavelength is determined by computing, on the basis of a reflectivity model of the structure 1; i.e., a mathematical model of a structure having the nominal characteristics of the structure 1. The laser wavelength is selected, within the above range, according to the availability of a laser having a beam wavelength close to the central wavelength.

The disclosure takes advantage of the thus determined processing conditions to reduce the variations in thickness of the useful layer 2.

Using a pulse laser beam 8, rather than a continuous laser, makes it possible to limit the heating at the beam 8 impact point P (shown in FIG. 4) on the useful layer 2 and the underlying volume thereof. A pulsed laser beam sweeping the free surface S of the useful layer 2 individually heats the various impact points of the useful layer 2. According to the disclosure, the heating of each point of impact of the useful layer 2 depends on the thickness of the useful layer 2 at the point of impact P and on the duration of the laser pulse.

The disclosure can more particularly be applied to structures of the silicon-on-insulator type. The insulating layer 3 may then comprise silicon dioxide. The insulating layer 3 may have a thickness of less than 150 nm, preferably of less than 50 nm, more preferably of less than 25 nm. The silicon useful layer 2 may have a thickness of less than 50 nm, preferably of less than 25 nm. Advantageously, the useful layer 2 may have, prior to the treatment, a variation in thickness of less than 3 nm, preferably of less than 2 nm, even more preferably of less than 1 nm.

Determining the Estimated Reflectivity of a Structure

Figure 5:
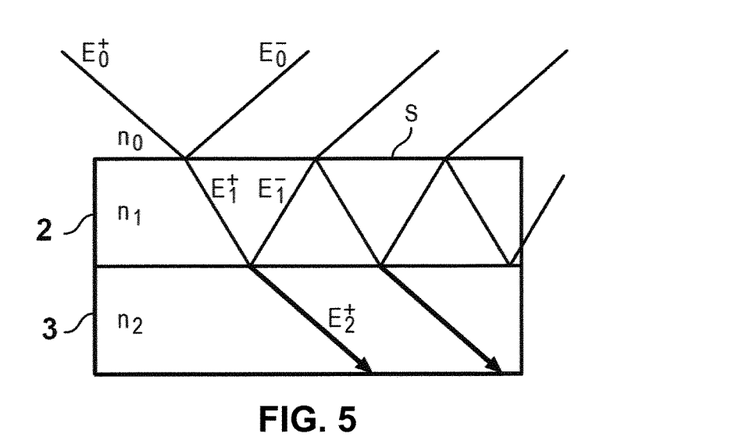
FIG. 5 schematically illustrates the reflections occurring in two layers of a structure.

FIG. 5 schematically illustrates the reflections occurring in the useful layer 2 and the insulating layer 3 of a structure 1 (the carrier substrate 4 is not shown).

A radius $E^+_0$ incident on the free surface S is partially reflected on the surface and partially transmitted through the useful layer 2.

The part of the transmitted beam is, in turn, partly reflected at the interface between the useful layer 2 and the insulating layer 3, and partly transmitted through the insulating layer 3. Such reflections/transmissions are repeated at each one of the interfaces of the structure, the reflected energy $E^-_0$ thus results from these complex interactions.

The reflectivity of a structure corresponds to the ratio between the reflected energy $E^-_0$ and the incident energy $E^+_0$.

As is well known per se, the reflectivity of a stack, such as the one formed by the structure 1, is determined by applying Fresnel equations, and depends on several parameters including the thickness of each layer, the polarization of the incident light flux, the angle of incidence and the wavelength of the luminous flux. In this regard, reference can be made to Appendix C of the book "Spectroscopic Ellipsometry and Reflectometry, a User Guide," by H. G. Tompkins and W. A. McGahan, published by Wiley Interscience Publication, 1999.

Operationally, for nominal parameters of a structure and of a luminous flux, the reflectivity is determined by widely available digital simulation software. The so-called IMD software, available for download on the World Wide Web at rxollc.com/idl/ and described in the publication "IMD-Software for Modeling the Optical Properties of Multilayer Films," by D. L. Windt, COMPUTER IN PHYSICS, Vol. 12, No. 4, July/August 1998.

The model established by such software makes it possible to obtain an estimated reflectivity of a real structure.

Using simulation, the estimated reflectivity of a structure, for a series of values of the wavelength of the incident ray, can thus be represented as a digital table or graphically, with the other parameters of the model being set at their nominal values.

Determining the Sensitivity of the Estimated Reflectivity

The sensitivity of the estimated reflectivity of the structure 1 relative to the insulating layer 3 (respectively, the useful layer 2) corresponds to the partial derivative of the reflectivity relative to the thickness of the insulating layer 3 (respectively, the useful layer 2).

In practice, such step of derivation is performed using digital derivation algorithms, well known per se, such as, for instance, the differential quotient method. Such algorithms may belong to the tools offered in digital simulation software, making it possible to determine the reflectivity of the structure, or may be available in separate software.

For example, the sensitivity of the estimated reflectivity of the structure 1 relative to the useful layer 2 can be calculated, on the basis of the established model, by taking the difference between the estimated reflectivity of the structure 1 for two different thicknesses of the useful layer 2, with the difference between such two thicknesses being 0.1 nm, for example, and the other parameters of the model remaining set at their nominal values.

Similarly, for the same structure 1, the sensitivity of the reflectivity of the structure 1 relative to the insulating layer 3 is calculated on the basis of the established model by taking the difference between the estimated reflectivity of the structure 1 for two different thicknesses of the insulating layer 3, with the difference between these two thicknesses being, for instance, 0.1 nm.

Figure 6:
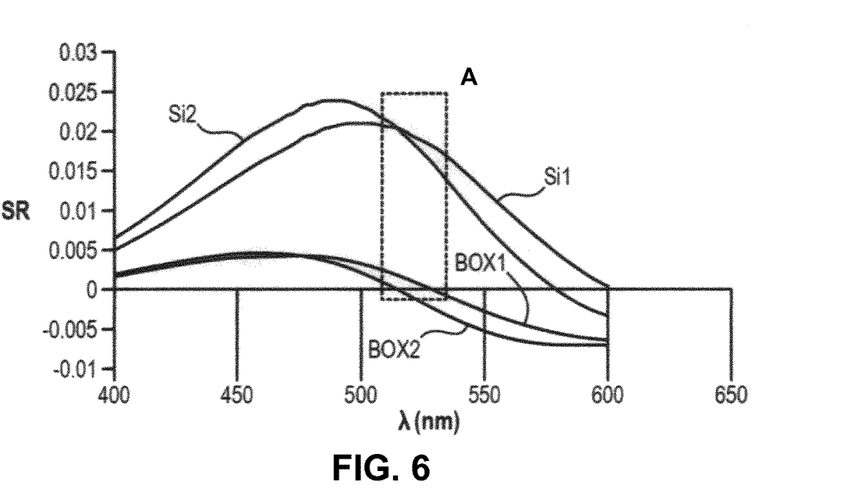
FIG. 6 shows the curves of the sensitivity of the estimated reflectivity for a plurality of silicon-on-insulator structures, versus the wavelength, relative to the thin silicon layer (Si1 and Si2 curves) and relative to the buried oxide layer (BOX1 and BOX2 curves)

Thus, FIG. 6 graphically shows the sensitivity of the estimated reflectivity (noted SR, expressed as $Å^{-1}$) of a plurality of silicon-on-silicon dioxide structures 1 as a function of the λ wavelength with a calculated non-polarized light having a normal incidence.

In FIG. 6, the Si1 curve represents the sensitivity of the estimated reflectivity relative to the useful layer versus the laser wavelength, in the case of a structure having a nominal thickness of the silicon useful layer 2 of 12 nm and a nominal thickness of the silicon oxide insulating layer 3 of 25 nm.

The Si2 curve represents the sensitivity of the estimated reflectivity relative to the useful layer versus the laser wavelength, in the case of a structure having a nominal thickness of the silicon useful layer 2 of 13 nm and a nominal thickness of the silicon oxide insulating layer 3 of 25 nm.

The BOX1 curve represents the sensitivity of the estimated reflectivity relative to the insulating layer versus the laser wavelength, in the case of a structure having a nominal thickness of the silicon useful layer 2 of 12 nm and a nominal thickness of the silicon oxide insulating layer 3 of 25 nm.

The BOX2 curve represents the sensitivity of the estimated reflectivity relative to the insulating layer versus the laser wavelength, in the case of a structure having a nominal thickness of the silicon useful layer 2 of 12 nm and a nominal thickness of the silicon oxide insulating layer 3 of 26 nm.

Selection of the Pulsed Laser Beam Wavelength

The wavelength of the central pulse laser is the wavelength, noted $\lambda_0$, which cancels the sensitivity of the estimated reflectivity of a structure 1 relative to the insulating layer 3.

For wavelengths of the pulsed laser close to the central wavelength $\lambda_0$, the applicant has confirmed that the useful layer 2 is heated substantially independently of the variations in thickness of the insulating layer 3.

"Wavelengths" close to the central wavelength means wavelengths ranging from $\lambda_{0-}15$ nm to $\lambda_{0+}15$ nm, even more preferably ranging from $\lambda_0-7$ nm to $\lambda_0+7$ nm.

In some cases, the wavelength of the pulsed laser may be so selected that the thinner the useful layer 2, the higher the temperature reached by the useful layer 2. This result is obtained when the sensitivity of the estimated reflectivity of the structure 1 given relative to the useful layer 2 is positive.

These two conditions relating to the wavelength of the luminous flux are noted heating mode A, as shown in FIG. 6.

According to the heating mode A, the intensity of the reflected radiation increases as the thickness of the active layer increases. Therefore, the heating is less important when the thickness of the useful layer 2 increases. Besides, as the sensitivity of the estimated reflectivity relative to the insulating layer 3 is close to 0, the heating is substantially independent of the variations in thickness of the insulating layer.

In other cases, the wavelength of the pulsed laser may be so selected that the thicker the useful layer 2, the higher the temperature reached by the useful layer 2. This result is obtained when the sensitivity of the estimated reflectivity of the structure 1 given relative to the useful layer 2 is negative.

Figure 9:
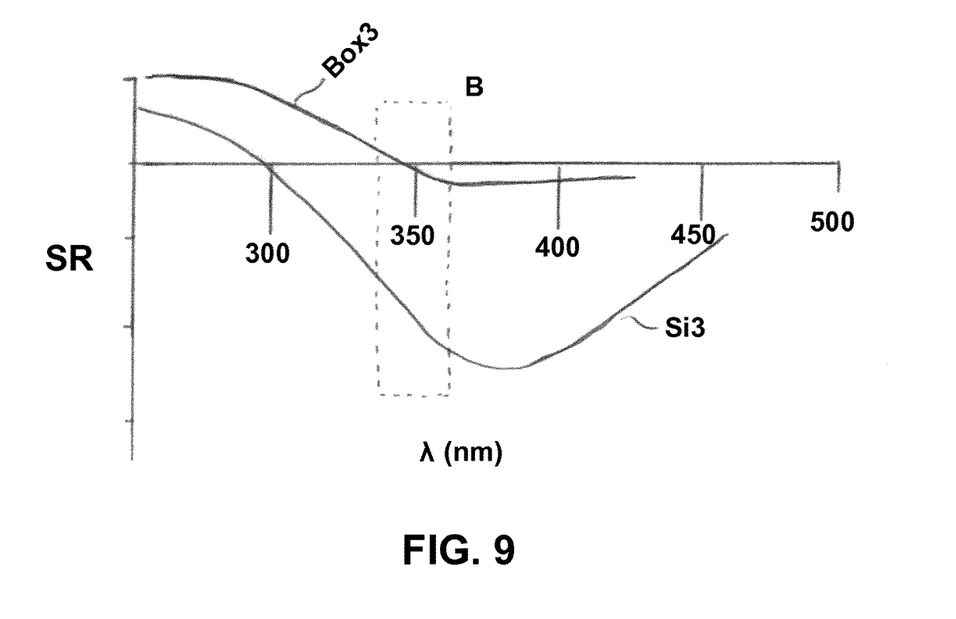
FIG. 9 illustrates the B heating mode wherein the intensity of the reflected radiation decreases as the thickness of the useful layer increases.

These two conditions relating to the wavelength of the luminous flux are noted heating mode B, and are illustrated in FIG. 9, wherein the BOX3 curve shows the sensitivity of the estimated reflectivity of a structure relative to the insulating layer versus the wavelength of the laser; and the Si3 curve shows the sensitivity of the estimated reflectivity of the structure relative to the useful layer versus the wavelength of the laser.

According to the heating mode B, the intensity of the reflected radiation decreases as the thickness of the useful layer increases. Therefore, the heating is greater when the thickness of the useful layer 2 increases. In addition, as the sensitivity of the estimated reflectivity relative to the insulating layer 3 is close to 0, the heating is substantially independent of the variations in thickness of the insulating layer.

It should be noted that $\lambda_0$ is determined on the basis of a model with the nominal thickness parameters of the structure 1. During the treatment according to the disclosure of a real structure, such structure can have parameters, and specifically thickness, that vary from the model. This is particularly true when the treatment comprises a thickening or a thinning of the active layer 2 of the structure. If they remain reasonable (of the order of 1 nm), such discrepancies do not question the validity of the model, i.e., the ability to selectively heat a useful layer 2 according to its variation in thickness only. This is remarkable, for example, in FIG. 6 by noting that the BOX1 and BOX2, respectively, Si1 and Si2, curves of the sensitivity of the estimated reflectivity of the structures remain similar in spite of a variation in the thickness of the insulating layer 3, respectively, of the useful layer 2, of 1 nm.

By way of illustration, a structure 1 made of silicon-on-insulator shall be considered, which comprises a layer of silicon dioxide having a nominal thickness of 25 nm, and a silicon layer having a nominal thickness of 12 nm.

According to FIG. 6 (BOX1 curve), the energy of a laser beam 8 having a wavelength equal to 510 nm corresponds to a heating mode A.

The structure 1 is then irradiated with a pulsed laser having the following characteristics:
a wavelength of 510 nm;
pulses of 10 ns;
a repetition frequency of the pulses of 10 kHz; and
pulse energy of 500 mJ/cm².

Figure 7:
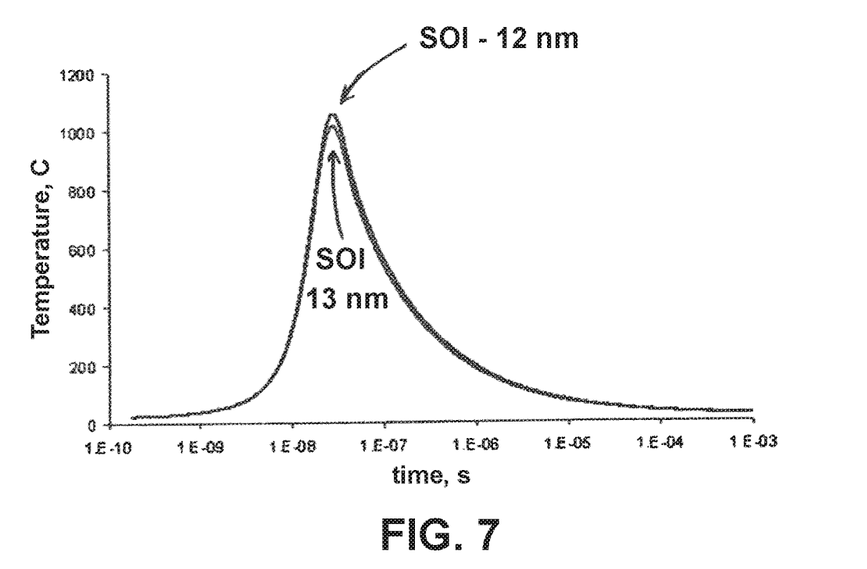
FIG. 7 shows the temperature rise generated respectively by a pulsed laser on a silicon-on-insulator structure comprising a 25 nm buried silicon oxide layer, a 12 nm, and, respectively, a 13 nm silicon layer in another area of the structure.

As shown in FIG. 7, the temperature reached by the silicon layer is 1,000° C. for a 12 nm layer (i.e., corresponding to the nominal thickness of the structure 1), while it is only 950° C. for a 13 nm layer (i.e., varying by 1 nm from the nominal thickness of the structure 1).

The thinner areas of the silicon layer are heated to higher temperatures than the thicker areas.

Determination of the Duration of the Laser Pulse

The heating of the useful layer 2 generated by the pulsed laser diffuses over a distance d according to the law:

$$d = \sqrt{(Dt)}$$

where t is the duration of a laser pulse, D is the thermal diffusion coefficient of the material composing the useful layer, and d is the distance traveled by the heat diffusion front.

If not controlled, such diffusion effect thus does not make it possible to selectively heat nearby areas, for example, areas included in the impact point of the laser beam.

When non-uniformities in thickness of relatively small wavelengths, in particular, smaller than the size of the impact point of the beam, are desired to be corrected anyway, the diffusion of heat has to be controlled. This is achieved by choosing the duration t of a pulse of the laser.

More specifically, if variations in thickness of the useful layer in its spectral components having a wavelength greater than a threshold I (I being possibly smaller than the dimension of the beam) are desired to be corrected, a duration of laser pulse smaller than $t_v$ is selected, where $t_v$ is defined by the following law:

$$t_v = \frac{l^2}{D}$$

Thus, for pulse durations t smaller than tv, a thermal equilibrium may not be reached over the entire surface of the impact point of the laser pulses on the useful layer 2, and the impact point does not undergo a uniform heating over its entire surface.

More specifically, the thinner areas of the impact point are not heated to the same temperature as the thickest areas of the impact point.

Figure 8:
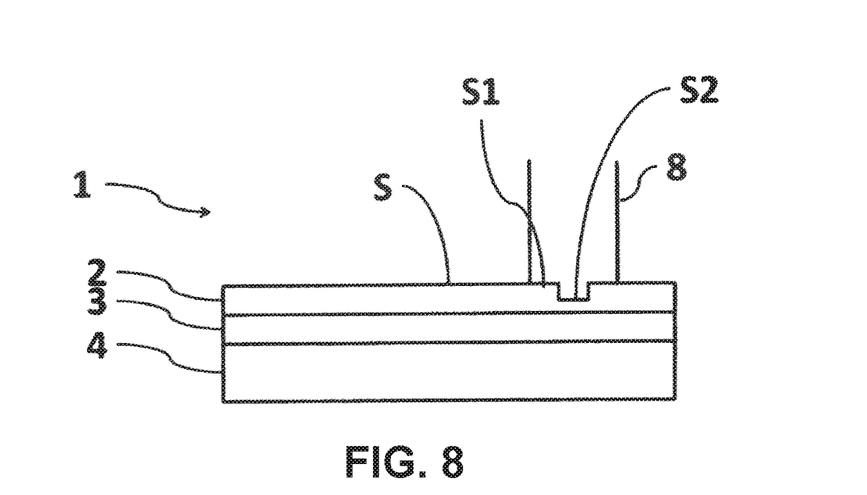
FIG. 8 is a block diagram of the heating of an area of the useful layer having a variation in thickness in a range scale smaller than the size of the pulsed laser beam.

As an exemplary application, the case of the SOI (silicon-on-insulator) structure 1, which has non-through holes, will be considered. Such holes contribute to the variations in the thickness of the useful layer 2, and such variations can be modeled, for example, as a spatial wave having a 1 micrometer wavelength.

"Non-through holes" means holes that do not extend through the entire thickness of the useful layer 2.

The thermal diffusion coefficient of silicon is equal to 87 micrometer$^2$/second. tv is then equal to 11.5 ns, when applying the previous formula and taking I=1 micrometer as the threshold value.

As illustrated in FIG. 8, a structure 1 has a region S1 that is thicker than a region S2, which thus forms a non-through hole. The regions S1 and S2 are irradiated with a pulsed laser beam 8, the point of impact of which has a size of several mm$^2$, i.e., much greater than the dimension S2. The wavelength of the laser corresponds to the conditions of the heating mode A, and the duration of the pulse is chosen to be equal to 10 ns, i.e., smaller than tv.

As the thermal equilibrium over the entire surface of the impact point is not reached for pulses having a duration smaller than tv, a more important heating can be noted in the area S2 than in the area S1. Such selective heating enables the reduction of the thickness variation when thickening the useful layer 2. For conditions according to a heating mode B, the opposite effect will be noted and a thickness correction by etching the useful layer 2 will thus be applied.

Particularly advantageously, the heating modes A and B are carried out with a pulse laser having at least one of the following characteristics:

The impact point P of the pulse laser beam 8 can have a surface greater than 0.1 mm$^2$, preferably greater than 10 mm$^2$;
Pulse duration smaller than 100 ns, preferably smaller than 50 ns, for instance, 10 ns;
Pulse energy ranging from 100 to 1,500 mJ/cm$^2$; and/or
A pulse repetition frequency ranging from 1 Hz to 10 kHz.

First Embodiment

In a first embodiment, illustrated in FIGS. 3 and 4, thickening by epitaxy the useful layer 2 of a structure 1 consisting of a silicon-on-insulator substrate has been considered.

The insulating layer 3 is a 25 nm layer of silicon dioxide.
The useful layer 2 is a 12 nm layer of silicon on an average and has a thickness variation ranging from 11.5 nm to 12.5 nm.

A preliminary step of modeling the structure leads to determining the sensitivities of the reflectivity of the structure 1 relative to the silicon layer (Si1 curve in FIG. 6) and the silicon dioxide layer (BOX1 curve in FIG. 6), respectively.

The dotted rectangle appearing in the graph of FIG. 6 shows a range of wavelengths suitable for a heating mode A. In the case of this example, a laser having a 51 nm wavelength has been selected.

The structure 1 is thus preferably installed on a structure support 5 in a reaction chamber 9.

Chemical species 6 in a gaseous form are introduced into the reaction chamber 9, with the chemical species 6 being capable of chemically reacting with the useful layer 2, with kinetics strictly increasing with the temperature of the useful layer 2.

Particularly advantageously, the chemical species 6 introduced into the reaction chamber may include at least one of the following species: silane, disilane, trisilane, monochlorosilane, dichlorosilane, trichlorosilane, tetrachlorosilane, germane, monochlorogermane, dichlorogermane, trichlorogermane, and/or tetrachlorogermane.

The chemical species 6 injected into the reaction chamber 9 are generally diluted in a carrier gas comprising at least one of the following gases: Nitrogen, Argon, and Dihydrogen.

The useful layer 2 is then heated by a pulsed laser beam 8, with the beam 8 sweeping, at least partially, the free surface S of the useful layer 2.

A window transparent to the pulse laser beam 8 is provided in the enclosure, so as to enable the pulsed laser beam 8 generated outside the reaction chamber 9 to produce a heating of the useful layer 2 positioned inside the reactive enclosure.

The free surface S of the useful layer 2 is then swept by moving the pulsed laser beam 8 and/or by moving the support 5 whereon the structure 1 is laid.

The useful layer 2 is thus heated at the point of impact P, upon the pulsed laser beam 8 impacting the free surface S of the useful layer 2.

Thus, when the pulsed laser beam 8 sweeps the surface, the heating is more important in the thinner areas of the active layer 2 than in the thicker areas, regardless of the variations in thickness of the insulating layer 3.

Such heating causes the reaction of the chemical species 6 with the useful layer 2.

In this embodiment, the chemical reaction is a reaction of thickening by epitaxy of the useful layer 2.

As the thinner areas of the useful layer 2 are exposed to a more important heating than the thick areas, the reaction of thickening by epitaxy takes place at a higher speed in the thin areas than in the thick areas.

When the useful layer 2 is thickened, the difference in thickness between the thin areas and the thick areas of the useful layer 2 thus decreases.

Thus, the structure 1 is irradiated with a pulsed laser having a wavelength of 510 nm, with 10 ns pulses, with the pulses being repeated at a frequency of 10 kHz, and each pulse having an energy of 500 mJ/cm$^2$, making it possible to heat the silicon layer. The treatment time is 10 seconds per irradiated area. The laser beam impact point is 10 mm$^2$.

During the irradiation, the structure 1 is in an atmosphere of chemical species 6 comprising a mixture of dichlorosilane and dihydrogen, under a pressure of 80 mT.

Such treatment executed on the whole structure 1 makes it possible to reduce the non-uniformity in thickness to 0.2 nm relative to an initial non-uniformity of 1 nm. Such non-uniformity corresponds to variations in thickness of the useful layer 2 with a spatial wavelength above the 0.9 micrometer threshold I.

In addition, for 10 ns pulses, it is possible to reduce the variations in thickness of the useful layer 2 with a wavelength above the threshold of the order of 1 micron, which is much smaller than the dimension of the beam impact point.

Second Embodiment

In a second embodiment, a thinning by etching a useful layer 2 has been considered.

A structure 1, the sensitivity curves of which are shown in FIG. 9, is thus preferably installed on a support structure 5 in a reaction chamber 9.

Chemical species 6 in a gaseous form are introduced into the reaction chamber 9, with the chemical species 6 being likely to chemically react to etch the useful layer 2, with kinetics strictly increasing with the temperature of the useful layer 2.

Particularly advantageously, the chemical species 6 introduced into the reaction chamber comprise at least one of the following species: HCL.

The chemical species 6 injected into the reaction chamber are generally diluted in a carrier gas comprising at least one of the following gases: Argon and Dihydrogen.

The useful layer 2 is then heated using a pulsed laser beam 8, with the beam 8 sweeping at least partially the free surface S of the useful layer 2. A window transparent to the pulsed laser beam 8 is provided in the enclosure, so as to enable the pulsed laser beam 8 generated outside the reaction chamber to heat the useful layer 2 positioned inside the reaction chamber.

The free surface S of the useful layer 2 is then swept by moving the pulse laser beam 8 and/or by moving the structure 1.

The wavelength of the laser beam 8 is so selected as to meet both conditions of a heating mode B shown in FIG. 9, for example, the wavelength thereof is so selected as to be different by less than 15 nm, preferably less than 7 nm, from the central wavelength of 350 nm. The other laser parameters are the same as those selected in the first embodiment.

Thus, when the pulsed laser beam 8 impacts the free surface S of the useful layer 2, the useful layer 2 is heated at the point of impact.

Moreover, when the pulsed laser beam 8 sweeps the free surface S of the useful layer 2, the heating is more important in the thicker areas of the active layer 2 than in the thinner areas.

Such heating causes the reaction of the chemical species 6 with the useful layer 2.

In this embodiment, the chemical reaction is a reaction of thinning by etching the useful layer 2.

As the thicker areas of the useful layer 2 undergo a more important heating than the thinner areas, the reaction of thinning by etching proceeds at a higher speed in the thick areas than in the thin areas.

The difference in thickness between the thin areas and the thick areas of the useful layer 2 thus decreases when the reaction of thinning by etching the useful layer 2 takes place.

During the irradiation, the structure 1 is in an atmosphere of chemical species 6 comprising a mixture of hydrochloric acid and of dihydrogen under a pressure ranging from 2.67 Pa to $1*10^5$ Pa (20 mTorr and 760 Torr).

Such treatment executed on the whole structure 1 makes it possible to reduce the non-uniformity in thickness relative to an initial non-uniformity of the useful layer 2. Such non-uniformity corresponds to variations in thickness of the useful layer 2 having a spatial wavelength above the 0.9 micrometer threshold I.

The invention claimed is:

1. A method for reducing thickness variations of a useful layer in a semiconductor structure, comprising:

providing a semiconductor structure including, from its rear side to its front side, a carrier substrate, an insulating layer, and a useful layer, the useful layer having a free surface;

placing the semiconductor structure in an atmosphere containing chemical species in a gaseous form, the chemical species being chemically reactive with the useful layer, kinetics of the chemical reaction being strictly increasing with the temperature of the useful layer; and at least partially sweeping the free surface of the useful layer with a pulsed laser beam to heat the free surface, a wavelength of the laser beam being different by less than 15 nm, from a central wavelength, for which the sensitivity of the estimated reflectivity of the structure relative to the insulating layer is zero, such that a heating profile of the free surface of the useful layer depends on variations in a thickness of the useful layer, and the heating results in a reduction of the variations in the thickness of the useful layer.

2. The method of claim 1, wherein a duration of pulses of the laser beam is less than $l^2/D$, wherein D is the coefficient of thermal diffusion in the useful layer, and l is a treatment threshold wavelength.

3. The method of claim 1, wherein the pulsed laser beam has a pulse duration of less than 100 ns.

4. The method of claim 1, wherein the useful layer is a layer of a semiconductor material comprising at least one of silicon, germanium, or silicon germanium alloy.

5. The method of claim 1, wherein the chemical species comprises an etchant for etching the useful layer, and the wavelength of the pulsed laser beam is selected so as to correspond to a negative value of the sensitivity of the estimated reflectivity of the structure relative to the useful layer.

6. The method of claim 5, wherein the chemical species comprises HCl.

7. The method of claim 1, wherein the chemical species are selected to thicken the useful layer by epitaxy, and the wavelength of the pulsed laser beam is selected so as to correspond to a positive value of the sensitivity of the estimated reflectivity of the structure relative to the useful layer.

8. The method of claim 7, wherein the chemical species comprises at least one of silane, disilane, trisilane, monochlorosilane, dichlorosilane, trichlorosilane, tetrachlorosilane germane, monochlorogermane, dichlorogermane, trichlorogermane, or tetrachlorogermane.

9. The method of claim 1, wherein the insulating layer comprises silicon dioxide.

10. The method of claim 1, wherein the insulating layer has a thickness of less than 150 nm.

11. The method of claim 10, wherein the insulating layer has a thickness of less than 50 nm.

12. The method of claim 1, wherein the useful layer has a thickness of less than 50 nm.

13. The method of claim 12, wherein the useful layer has a thickness of less than 25 nm.

14. The method of claim 1, wherein an impact point of the laser beam on the free surface of the useful layer has an area greater than 0.1 $mm^2$.

15. The method of claim 14, wherein an impact point of the laser beam on the free surface of the useful layer has an area greater than 10 $mm^2$.

16. The method of claim 1, wherein the pulsed laser beam has a pulse energy in a range extending from 100 to 1,500 $mJ/cm^2$.

17. The method of claim 1, wherein the pulsed laser beam has a pulse repetition frequency in a range extending from 1 Hz to 10 kHz.

18. The method of claim 1, wherein the useful layer has a variation in thickness of less than 3 nm.

19. The method of claim 18, wherein the useful layer has a variation in thickness of less than 2 nm.

20. The method of claim 1, wherein the wavelength of the beam is different by less than 7 nm from the central wavelength.

* * * * *